United States Patent
Balimann et al.

(10) Patent No.: US 10,840,396 B2
(45) Date of Patent: Nov. 17, 2020

(54) OPTOELECTRONIC MODULES WITH ALIGNMENT SPACERS AND METHODS FOR ASSEMBLING THE SAME

(71) Applicant: ams Sensors Singapore Pte. Ltd., Singapore (SG)

(72) Inventors: Martin Lukas Balimann, Zurich (CH); Matthias Gloor, Boswil (CH); Hartmut Rudmann, Jona (CH); Nicola Spring, Wangen (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/093,840

(22) PCT Filed: Apr. 11, 2017

(86) PCT No.: PCT/SG2017/050204
§ 371 (c)(1),
(2) Date: Oct. 15, 2018

(87) PCT Pub. No.: WO2017/180060
PCT Pub. Date: Oct. 19, 2017

(65) Prior Publication Data
US 2019/0081187 A1    Mar. 14, 2019

Related U.S. Application Data

(60) Provisional application No. 62/322,966, filed on Apr. 15, 2016.

(51) Int. Cl.
*H01L 31/0232* (2014.01)
*G03B 17/12* (2006.01)
(Continued)

(52) U.S. Cl.
CPC ............ *H01L 31/0232* (2013.01); *G02B 6/42* (2013.01); *G02B 6/4239* (2013.01);
(Continued)

(58) Field of Classification Search
CPC ..... H01L 31/0232; G02B 6/42; G02B 6/4239; G02B 6/4244; G02B 7/003
See application file for complete search history.

(56) References Cited

U.S. PATENT DOCUMENTS

| 5,011,247 A | 4/1991 | Boudreau et al. |
| 5,537,503 A | 7/1996 | Tojo et al. |

(Continued)

FOREIGN PATENT DOCUMENTS

| CA | 1313248 | 1/1993 |
| CA | 2141905 | 8/1999 |

(Continued)

OTHER PUBLICATIONS

Guo et al., "Fast active alignment in photonics device packaging," IEEE Electronic Components and Technology Conference, Jun. 2004, 1: 813-817.

(Continued)

*Primary Examiner* — Christine A Enad
(74) *Attorney, Agent, or Firm* — Michael Best and Friedrich LLP

(57) ABSTRACT

Optoelectronic modules, such as proximity sensors, two-dimensional and three-dimensional cameras, structured- or encoded-light emitters, and projectors include optical assemblies and active optoelectronic components that are light sensitive or emit light. The optical assemblies are aligned to the active optoelectronic components via alignment spacers and adhesive. The alignment spacers include surfaces operable to limit the lateral migration of adhesive thereby preventing the contamination of the active optoelec- (Continued)

tronic components with adhesive. In some instances, small optoelectronic module footprints can be maintained without compromising the integrity of the adhesive.

16 Claims, 4 Drawing Sheets

(51) Int. Cl.
    *G03B 21/14*     (2006.01)
    *G02B 19/00*     (2006.01)
    *G02B 7/00*     (2006.01)
    *H01L 27/146*     (2006.01)
    *G03B 43/00*     (2006.01)
    *G02B 6/42*     (2006.01)

(52) U.S. Cl.
    CPC .......... *G02B 6/4244* (2013.01); *G02B 7/003* (2013.01); *G02B 19/0014* (2013.01); *G02B 19/0047* (2013.01); *G02B 19/0076* (2013.01); *G03B 17/12* (2013.01); *G03B 21/142* (2013.01); *G03B 43/00* (2013.01); *H01L 27/14618* (2013.01)

(56) References Cited

U.S. PATENT DOCUMENTS

| | | | |
|---|---|---|---|
| 5,590,456 A | 1/1997 | Armington et al. | |
| 5,745,624 A | 4/1998 | Chan et al. | |
| 6,164,837 A | 12/2000 | Haake et al. | |
| 6,205,266 B1 | 3/2001 | Palen et al. | |
| 6,283,644 B1 | 9/2001 | Gilliland et al. | |
| 6,376,268 B1 | 4/2002 | Verdiell | |
| 6,483,969 B1 | 11/2002 | Yap et al. | |
| 6,492,614 B2 | 12/2002 | Murdza et al. | |
| 6,512,642 B1 | 1/2003 | Bourcier et al. | |
| 6,676,305 B2 | 1/2004 | Dallas et al. | |
| 6,709,169 B2 | 3/2004 | Rossi | |
| 6,759,687 B1 * | 7/2004 | Miller | H01L 33/58 257/432 |
| 6,905,260 B2 | 6/2005 | Anderson et al. | |
| 6,955,480 B2 | 10/2005 | Gallup et al. | |
| 7,177,506 B2 | 2/2007 | Baldwin et al. | |
| 7,202,952 B2 | 4/2007 | Hu et al. | |
| 7,251,398 B2 | 7/2007 | Baets et al. | |
| 7,263,260 B2 | 8/2007 | Singh et al. | |
| 8,063,975 B2 | 11/2011 | Butterfield et al. | |
| 8,774,576 B2 | 7/2014 | Shiraishi | |
| 8,830,466 B2 | 9/2014 | Shastri et al. | |
| 9,156,168 B2 | 10/2015 | By | |
| 2002/0054428 A1 | 5/2002 | Seward | |
| 2002/0122637 A1 | 9/2002 | Anderson et al. | |
| 2005/0067681 A1 | 3/2005 | De Villeneuve et al. | |
| 2005/0175298 A1 * | 8/2005 | Matta | G02B 6/4206 385/93 |
| 2005/0270403 A1 | 12/2005 | Adachi et al. | |
| 2008/0260330 A1 | 10/2008 | Rosiewicz et al. | |
| 2012/0140101 A1 | 6/2012 | Afshari et al. | |
| 2012/0230670 A1 * | 9/2012 | Hirooka | H01L 27/14618 396/529 |
| 2013/0264586 A1 | 10/2013 | Rudmann et al. | |
| 2015/0034975 A1 * | 2/2015 | Rudmann | H01L 27/14625 257/82 |
| 2015/0102211 A1 | 4/2015 | Mathai et al. | |

FOREIGN PATENT DOCUMENTS

| | | |
|---|---|---|
| CA | 2334279 | 12/1999 |
| CN | 1870723 A | 11/2006 |
| EP | 1134607 | 1/2002 |
| EP | 1351316 | 10/2003 |
| EP | 1351316 A2 | 10/2003 |
| GB | 2433588 | 6/2007 |
| JP | 2005292242 A | 10/2005 |
| JP | 2007123642 A | 5/2007 |
| WO | WO 2005002004 | 3/2005 |
| WO | WO 2015016772 | 2/2015 |

OTHER PUBLICATIONS

Kraft et al., "UV replication technology for micro optical applications and bonding challenges using active alignment," IEEE Microelectronics Pacaging Conference, Sep. 2013, 1-8.

Lecarpentier et al., "A new route for cost-effective multi-process assembly of an optical silicon bench at the sub-micron accuracy," IEEE Electronics Manufacturing Technology Symposium, Jul. 2004, 158-159.

Leers et al., "Pick and align—High precision active alignment of optical components," IEEE Electronic Components and Technology Conference, May 2012, 208-212.

PCT International Search Report in International Appln. No. PCT/SG2017/050124, dated Aug. 1, 2017, 3 pages.

The National Intellutual Property Administration of the People's Republic of China First Office Action for Application No. 201780029684.X dated Jul. 3, 2020 (21 pages including English translation).

\* cited by examiner

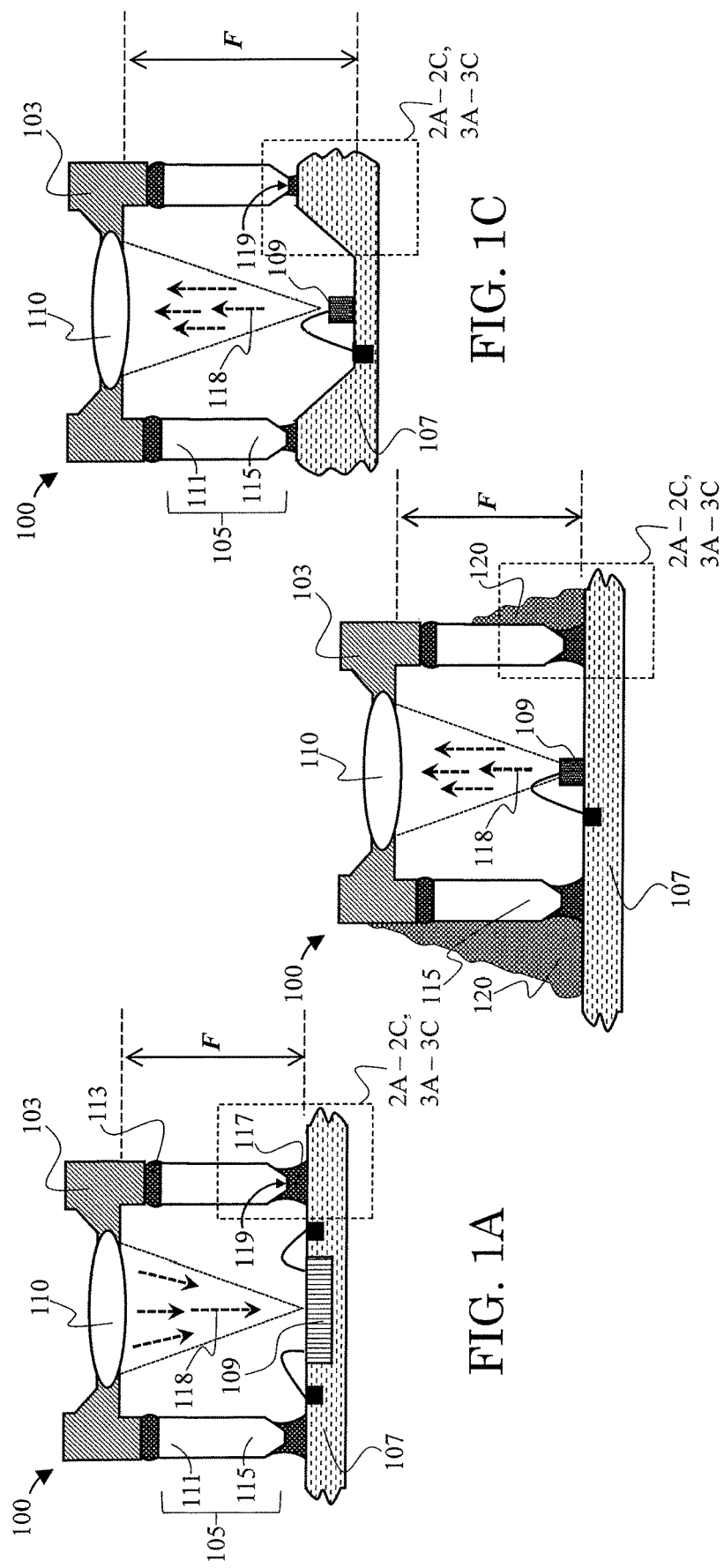

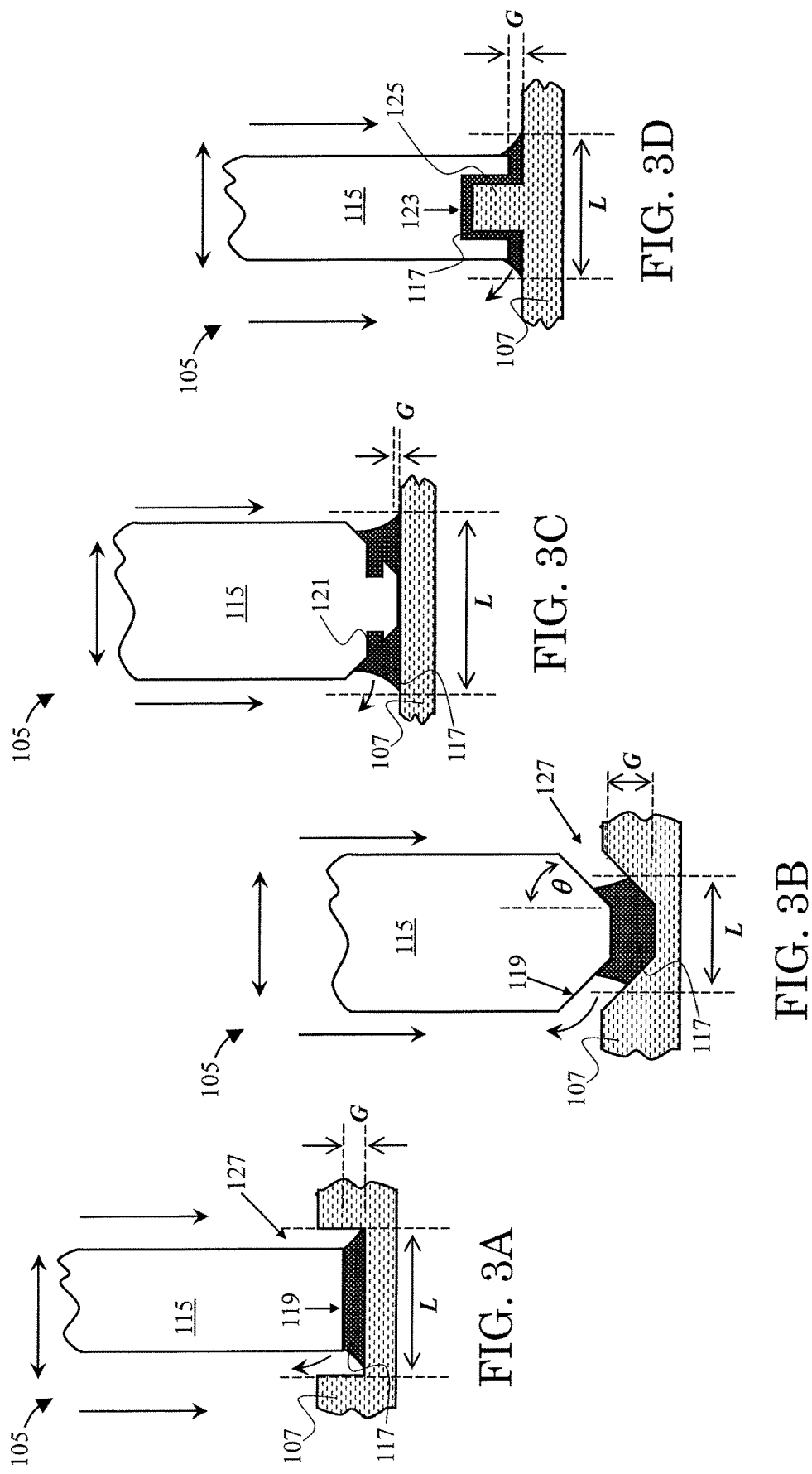

OPTOELECTRONIC MODULES WITH ALIGNMENT SPACERS AND METHODS FOR ASSEMBLING THE SAME

BACKGROUND

An optoelectronic module can include an optical assembly, an active optoelectronic component mounted to a substrate, and a spacer disposed between the optical assembly and the active optoelectronic component. An optical assembly can include optical elements such as refractive or diffractive optical elements, a microlens array, an aperture, and one or more spectral filters. The optical assembly can further include spacers or barrels configured to house the optical elements. An active optoelectronic component can be a light-emitting active optoelectronic component (e.g., a laser diode, a light emitting diode, or an array of each) or a light-sensitive active optoelectronic component (e.g., a photodiode, complementary metal-oxide semiconductor—(CMOS) or charged-coupled device—(CCD) based image sensor). In some instances, an optoelectronic module can contain both light-emitting and light-sensitive active optoelectronic components wherein each active optoelectronic component may be aligned with a corresponding optical assembly. Precise alignment of the optical assembly to the active optoelectronic component can be necessary for optimal module performance.

For example, an optoelectronic module such as a camera may include an optical assembly characterized by a particular focal length, and a light-sensitive active optoelectronic component such as an image sensor. In such instances, the optical assembly focal length must be aligned with the image sensor.

Alignment can be accomplished via an active alignment process. In some instances, the active alignment process involves fixing an optical assembly to a spacer (e.g., by adhesive) while in some instances the spacer may be included with (e.g., integral or formed into) the optical assembly. Then excessive adhesive is deposited onto the substrate thereby forming a bond line, and the optical assembly is roughly aligned with the active optoelectronic component via the spacer such that the spacer is roughly fixed to the substrate via the deposited (uncured) adhesive. In some instances, where the optoelectronic module includes an image sensor, for example, light reflecting from a test target can be directed through an optical assembly roughly onto the light-sensitive optoelectronic component. Alignment data, such as the intensity of the light reflecting from the test target, can then be collected by the optoelectronic component. Alignment data can then be used to refine the position of the optical assembly with respect to the active optoelectronic component as the previously deposited adhesive is in an uncured state. In such instances, as the optical assembly is fixed or integral to the spacer, the spacer position may be adjusted (e.g., laterally, vertically, or both) until the optical assembly is precisely aligned with the active optoelectronic component. The adhesive (e.g., along the bond line) is then at least partially cured thereby fixing the optical assembly and active optoelectronic component in place with respect to each other. Since excessive adhesive is deposited between the substrate and the spacer, adjustments (e.g., laterally and/or vertically) to the spacer substrate position can be accomplished without exposing adhesive-free gaps or compromising mechanical integrity along the bond line between the spacer and the substrate.

Moreover, sufficient adhesive can be used to maintain a light-tight seal between the substrate and the spacer such that stray light (or crosstalk) cannot pass through the bond line. Stray light might otherwise impinge on a light-sensitive active optoelectronic component, or be emitted from a light-emitting active optoelectronic component potentially causing eye-safety concerns.

The aforementioned active alignment process can also be adapted to optoelectronic modules that include light-emitting active optoelectronic components. In such instances, rather than the active optoelectronic component collecting alignment data, the active optoelectronic component can direct light though the optical assembly. Then an external imaging device can collect the alignment data. The process proceeds as described in the preceding paragraphs until precise alignment between the optical assembly and active optoelectronic component is achieved.

The active alignment process, as described above, requires an increase in the optoelectronic module footprint (i.e., lateral dimensions) to accommodate excessive adhesive expelled from space between the spacer and the substrate. Attempts to reduce the footprint can result in adhesive migrating onto the active optoelectronic component thereby destroying it. Further, attempts to reduce the amount of adhesive along the bond line may result in: 1) adhesive-free gaps between the substrate and spacer, 2) areas between the substrate and spacer that are not sufficiently light-tight, and 3) areas between the substrate and spacer with poor mechanical properties (e.g., areas where the substrate and spacer may delaminate).

SUMMARY

The present disclosure describes optoelectronic modules having one or more alignment spacers. The one or more alignment spacers include features operable to limit the lateral migration of adhesive onto active optoelectronic components. In some instances, the alignment spacers can permit a small bond line and thereby a small module footprint. In some instances, the alignment spacers can, in conjunction with the adhesive, provide superior mechanical stability. Further, in some instances, the one or more alignment spacers can provide a light-tight seal.

For example, in one aspect an optoelectronic module includes an optical assembly fixed to a first extension of an alignment spacer. The optical assembly is fixed to the first extension with an optical assembly adhesive. The optoelectronic module further includes a substrate fixed to a second extension of the alignment spacer. The substrate is fixed to the second extension with a substrate adhesive. The optoelectronic module further includes an active optoelectronic component mounted to the substrate and substantially aligned with the optical assembly. The first and second extensions are positioned on laterally opposing sides of the alignment spacer. The second extension of the alignment spacer includes a surface operable to limit the lateral migration of the substrate adhesive.

In another aspect, for example, an optoelectronic module includes an alignment spacer having first and second extensions positioned on laterally opposing sides of the alignment spacer, wherein the second extension includes one or more chamfered surfaces. The one or more chamfered surfaces delineate a surface operable to limit the lateral migration of a substrate adhesive.

In another aspect, for example, an optoelectronic module includes an alignment spacer having first and second extensions positioned on laterally opposing sides of the alignment spacer, wherein the second extension includes one or more chamfered surfaces having a groove. The one or more chamfered surfaces delineate a surface operable to limit the lateral migration of a substrate adhesive.

In another aspect, for example, an optoelectronic module includes an alignment spacer having first and second extensions positioned on laterally opposing sides of the alignment spacer, wherein the second extension includes one or more grooves.

In another aspect, for example, an optoelectronic module includes a substrate, wherein the substrate includes one or more alignment extensions. The one or more alignment extensions are operable to integrate with the one or more grooves.

In another aspect, for example, an optoelectronic module includes a substrate, wherein the substrate includes one or more sockets. The sockets are configured such that one or more second extensions can be integrated within the one or more sockets.

In another aspect, for example, an optoelectronic module includes an optical assembly. The optical assembly includes one or more optical elements.

In another aspect, for example, an optoelectronic module includes an optical assembly characterized by a focal length. A distance between the optical assembly and an active optoelectronic component is substantially equal to the focal length.

In another aspect, for example, an optoelectronic module includes an optical assembly. The optical assembly includes one or more optical elements. The one or more optical elements is a microlens array, a refractive optical element, and/or a diffractive optical element.

In another aspect, for example, an optoelectronic module includes an active optoelectronic component. The active optoelectronic component is a light-emitting diode, a laser diode, and/or an array of light-emitting diodes and/or laser diodes operable to generate a wavelength or range of wavelengths of electromagnetic radiation.

In another aspect, for example, an optoelectronic module includes optical assembly. The optical assembly further includes a spectral filter.

In another aspect, for example, an optoelectronic module includes an active optoelectronic component. The active optoelectronic component is a light-emitting diode, a laser diode, and/or an array of light-emitting diodes and/or laser diodes operable to generate a wavelength or range of wavelengths of electromagnetic radiation. The optoelectronic module of further includes optical assembly adhesive and substrate adhesive. The substrate adhesive and the optical assembly adhesive are substantially non-transparent to the wavelength or range of wavelengths of electromagnetic radiation generated by the active optoelectronic component.

In another aspect, for example, an optoelectronic module includes an active optoelectronic component. The active optoelectronic component is one or more light-sensitive pixels. The one or more light-sensitive pixels are sensitive to a wavelength or range of wavelengths of electromagnetic radiation.

In another aspect, for example, an optoelectronic module includes an active optoelectronic component. The active optoelectronic component is one or more light-sensitive pixels. The one or more light-sensitive pixels are sensitive to a wavelength or range of wavelengths of electromagnetic radiation. The optoelectronic module of further includes optical assembly adhesive and substrate adhesive. The substrate adhesive and the optical assembly adhesive are substantially non-transparent to the wavelength or range of wavelengths of electromagnetic radiation to which the active optoelectronic component is sensitive.

In another aspect, for example, an optoelectronic module includes supplemental adhesive. The supplemental adhesive is substantially non-transparent to the wavelength or range of wavelengths of electromagnetic radiation generated by an active optoelectronic component. The supplemental adhesive is at least in partial contact with the substrate, substrate adhesive, alignment spacer, optical assembly adhesive, and/or optical assembly thereby forming a light-tight barrier laterally surrounding the active optoelectronic component.

In another aspect, for example, an optoelectronic module includes supplemental adhesive. The supplemental adhesive is substantially non-transparent to the wavelength or range of wavelengths of electromagnetic radiation to which an active optoelectronic component is sensitive. The supplemental adhesive is at least in partial contact with the substrate, substrate adhesive, alignment spacer, optical assembly adhesive, and/or optical assembly thereby forming a light-tight barrier laterally surrounding the active optoelectronic component.

This disclosure also describes methods for manufacturing optoelectronic modules having one or more alignment spacers. The method includes depositing uncured substrate adhesive onto a substrate, and mounting an optical assembly and alignment spacer onto the substrate. The method further includes the step of adjusting the position of the optical assembly with respect to the active optoelectronic component via the alignment spacer; and directing electromagnetic radiation to the uncured substrate adhesive such that the uncured substrate adhesive is at least partially cured.

In another aspect, for example, a method includes the step of depositing uncured supplemental adhesive onto at least a portion of the substrate, substrate adhesive, alignment spacer, optical assembly adhesive, and/or optical assembly. The method further includes the step of directing electromagnetic radiation to the uncured supplemental adhesive such that the uncured supplemental adhesive is at least partially cured thereby forming a light-tight barrier laterally surrounding the active optoelectronic component.

In another aspect, for example, a method includes activating the active optoelectronic component, and directing electromagnetic radiation through the optical assembly to the active optoelectronic component. The method further includes the step of collecting alignment data with the active optoelectronic component, and adjusting the position of the optical assembly with respect to the active optoelectronic component via the alignment spacer. The position is determined by the alignment data collected by the active optoelectronic component.

In another aspect, for example, a method includes activating the active optoelectronic component, and directing electromagnetic radiation through the optical assembly from the active optoelectronic component. The method further includes the step of collecting alignment data with an external imaging device, and adjusting the position of the optical assembly with respect to the active optoelectronic component via the alignment spacer. The position being determined by the alignment data collected by the imaging device.

Other aspects, features and advantages will be apparent from the following detailed description, the accompanying drawings, and the claims.

BRIEF DESCRIPTION OF THE DRAWINGS

FIG. 1A-FIG. 1C depict example optoelectronic modules with alignment spacer.

FIG. 3A-FIG. 3D depict example alignment spacers.

DETAILED DESCRIPTION

Figure 2A:
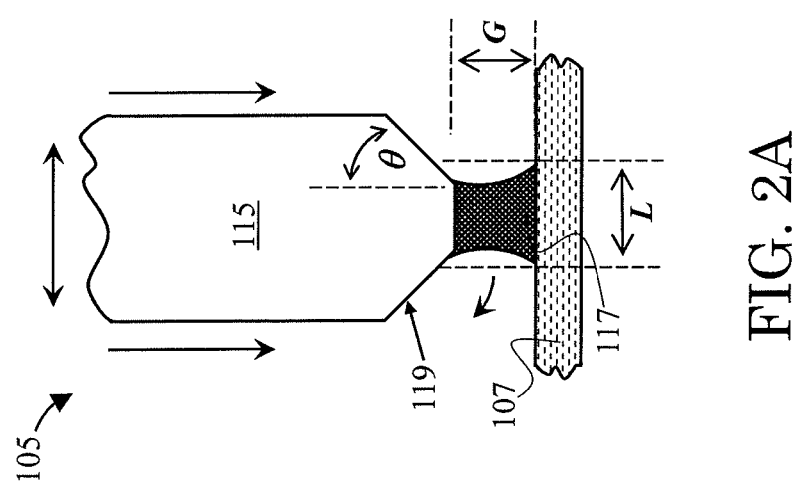
FIG. 2A-FIG. 2C depict a portion of an example optoelectronic module.

As shown in FIG. 1A, an optoelectronic module 100 includes an optical assembly 103, an alignment spacer 105, a substrate 107, and an active optoelectronic component 109 mounted to the substrate 107. The optoelectronic module 100 can be any module operable to collect light, emit light, or both. For example, the optoelectronic module 100 can be a proximity sensor, two-dimensional camera, three-dimensional camera, time-of-flight camera, pattern or encoded-light projector, or an image projector.

The optical assembly 103, as mentioned above, can include optical elements 110 such as refractive or diffractive optical elements, a microlens array or any combination of the aforementioned. The optical elements 110 can be composed of optical resins or glasses and collectively may be characterized by a focal length F or other optical parameter necessary useful for the active alignment process. The optical assembly 103 can further include one or more apertures (e.g., composed of black chrome), and spectral filters (e.g., composed of polyester, resin, or dielectric materials). And can further include spacers or barrels configured to house the optical elements 110. The spacers or barrels can be manufactured by injection molding or may even be formed from non-transparent substrates (e.g., printed circuit boards) into which througholes (e.g., respectively filled with optically refractive material) have been incorporated.

The alignment spacer 105 is non-transparent and can be manufactured by injection molding in some instances. The alignment spacer 105 includes a first extension 111. In some instances, the optical assembly 103 can be fixed to the first extension 111 by an optical assembly adhesive 113. The optical assembly adhesive 113 can be at least partially cured by electromagnetic radiation (e.g., ultraviolet or infrared light). In other instances, the alignment spacer 105 may be integral to (e.g., manufactured with) the optical assembly 103 in which the first extension 111, and by inference the alignment spacer 105, would be subsumed into the optical assembly 103. For example, the optical assembly 103 can include a barrel that is configured to both house optical elements 110 and include a contiguous extension that forms the alignment spacer 105. In such instances, the alignment spacer 105 may be considered a portion of the optical assembly 103.

The alignment spacer 105 further includes a second extension 115. The first extension 111 and second extension 115 can be positioned on laterally opposing sides of the alignment spacer 105. The substrate 107 can be fixed to the second extension 115 by a substrate adhesive 117. The substrate 107 can be a printed circuit board, for example, or other material onto which the active optoelectronic component 109 can be suitably mounted, such as a lead frame. The active optoelectronic component 109 can be a light-emitting active optoelectronic component (e.g., a laser diode, a light emitting diode, or an array of each) or a light-sensitive active optoelectronic component (e.g., a photodiode, complementary metal-oxide semiconductor—(CMOS) or charged-coupled device—(CCD) based image sensor). Accordingly, the active optoelectronic component can be operable to emit or be sensitive to a particular wavelength or range of wavelengths of electromagnetic radiation 118 (i.e., light).

As described above, since the optical assembly 103 is fixed to the alignment spacer 105, the alignment spacer 105 can be used to actively align the optical assembly 103 to the active optoelectronic component 109 and can be fixed in place by the substrate adhesive 117. The second extension 115 includes a surface 119 operable to limit the lateral migration of the substrate adhesive 117. By limiting the lateral migration of the substrate adhesive 117, the surface 119 can prevent the excess substrate adhesive 117 from migrating onto the active optoelectronic component 109, thereby permitting a smaller optoelectronic module footprint. Moreover, the substrate adhesive 117 can exhibit better mechanical stability, and provide a light-tight, gap-free bond line between the substrate 107 and the alignment spacer 105 as discussed in greater detail below.

FIG. 1A FIG. 1C depict the example optoelectronic module 100 with different substrates 107 and different active optoelectronic components 109. FIG. 1A depicts a light-sensitive active optoelectronic component 109 (depicted here as a CMOS or CCD image sensor) mounted to a substrate 107 (depicted here as a printed circuit board). The optical assembly 103 is characterized by a focal length F, and is aligned to the active optoelectronic component 109 via the spacer 105 and substrate adhesive 117 such that the distance between the optical assembly 103 and the active optoelectronic component 109 is substantially equal to the focal length F. In such instances, light 118 may be focused by the optical assembly 103 onto the active optoelectronic component 109.

FIG. 1B depicts a light-emitting active optoelectronic component 109 (depicted here as a light-emitting diode, laser diode, or an array of diodes) mounted to a substrate 107 (depicted here as a printed circuit board). Here to, the optical assembly 103 is characterized by a focal length F, and is aligned to the active optoelectronic component 109 via the spacer 105 and substrate adhesive 117 such that the distance between the optical assembly 103 and the active optoelectronic component 109 is substantially equal to the focal length F. In such instances, light 118 emitted by the active optoelectronic component 109 may be focused, projected, or amplified, for example, by the optical assembly 103. FIG. 1B also depicts supplemental adhesive 120. Supplemental adhesive 120 can be non-transparent to light 118. Further, supplemental adhesive 120 may be in contact with at least a portion of the optoelectronic module 100 (i.e., the supplemental adhesive 120 may be at least in partial contact with the substrate 107, substrate adhesive 117, alignment spacer 105, optical assembly adhesive 113, and/or optical assembly 103) thereby forming a light-tight barrier laterally surrounding the active optoelectronic component 109.

FIG. 1C depicts a light-emitting active optoelectronic component 109 (depicted here as a light-emitting diode, laser diode, or an array of diodes) mounted to a substrate 107 (depicted here as a lead frame). Again, the optical assembly 103 is characterized by a focal length F, and is aligned to the active optoelectronic component 109 via the spacer 105 and substrate adhesive 117 such that the distance between the optical assembly 103 and the active optoelectronic component 109 is substantially equal to the focal length F. In such instances, light 118 emitted by the active optoelectronic component 109 may be focused, projected, or amplified, for example, by the optical assembly 103.

Figure 2B:
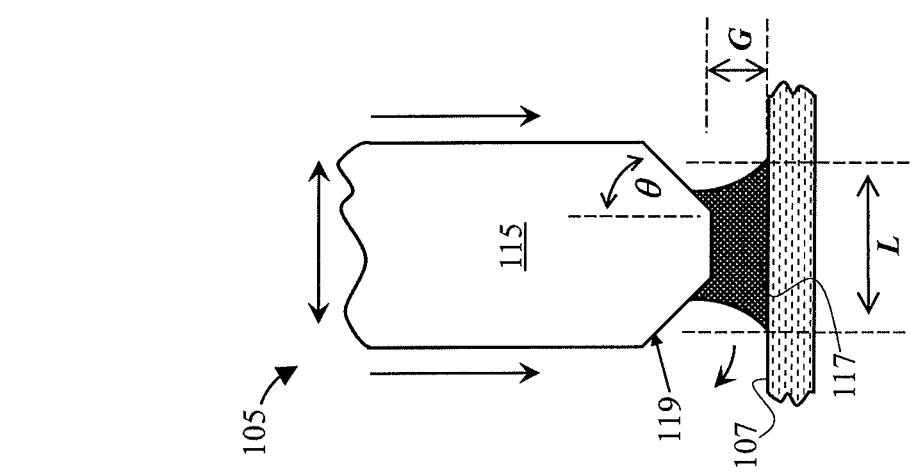
Figure 2C:
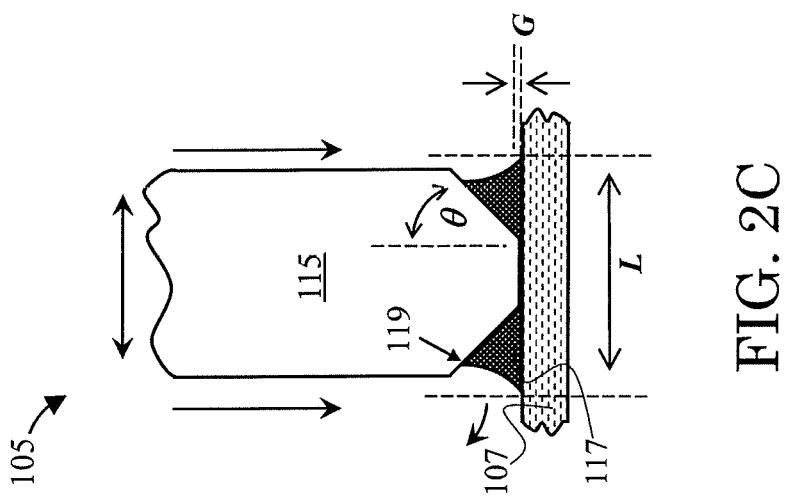

FIG. 2A FIG. 2C depict an enlarged view of a portion of the optoelectronic module 100 depicted in FIG. 1A-FIG. 1C. FIG. 2A depicts the second extension 115 of the alignment spacer 105. As described above, the extension includes a surface 119 operable to limit the lateral migration of substrate adhesive 117. The second extension 115 is chamfered at an angle θ as in the depicted example such that the surface 119 is operable to draw substrate adhesive 117 away from the substrate 107. Surface interaction between the substrate adhesive 117 and the surface 119, together with other factors, such as adhesive viscosity, specific gravity, thixotropic index, and chamfer angle θ, can be refined such that the substrate adhesive 117 is drawn away from the substrate 107 as depicted. For example, the substrate adhesive 117 can have an as deposited viscosity of 54,000 mPa·s, a specific gravity of 1.3 g/cm$^3$, a thixotropic index of 4.4 ($\frac{1}{10}$ s$^{-1}$), and a chamfer angle θ of 30°.

FIG. 2A-FIG. 2C depict the same second extension 115 of the alignment spacer 105 but each figure depicts a different gap G between the alignment spacer 105 and the substrate 107, and a lateral spread L of the substrate adhesive 117 (i.e., the bond line width). FIG. 2A-FIG. 2C illustrate a number of acceptable gaps G and lateral spreads L that may be accommodated by the alignment spacer 105. In each case, some excess substrate adhesive 117 is drawn away from the substrate 107. In some instances, for example as depicted in FIG. 2B and FIG. 2C, substrate adhesive 117 can adheres to a greater area (i.e., a greater portion of the surface 119) thereby enhancing mechanical stability.

FIG. 3A-FIG. 3D depict an enlarged view of a portion of the optoelectronic module 100 depicted in FIG. 1A-FIG. 1C with a number of different example alignment spacers. FIG. 3A depicts a substrate 107 with a socket 127. The socket 127 can be configured such that the second extensions 115 can be integrated within the socket 127. In this instance, substrate adhesive 117 can be limited by the socket 127 as well as the surface 119. FIG. 3B depicts another version of the socket 127. In this instance, the socket 127 may be chamfered such that the second extension 115 may be integrated within the socket 127. As above, both the socket 127 and the surface 119 may limit the lateral migration of the substrate adhesive 117.

FIG. 3C depicts an alignment spacer 105 with a chamfered second extension 115. The chamfered second extension 115 delineating the surface 119 includes at least one groove 121. In this instance, substrate adhesive 117 may be drawn away from the substrate 107 and the groove may be act as a reservoir for excess substrate adhesive 117 thereby limiting the lateral migration of substrate adhesive 117.

FIG. 3D depicts an alignment spacer 105 wherein the second extension 115 includes a groove 123. FIG. 3D also depicts a substrate 107 with an alignment 125. The alignment extension 125 is operable to be integrated within the groove 123. In this, and other configurations, eye-safety may be maintained even if, for example, delamination of the substrate adhesive 117 occurs.

Figure 4:
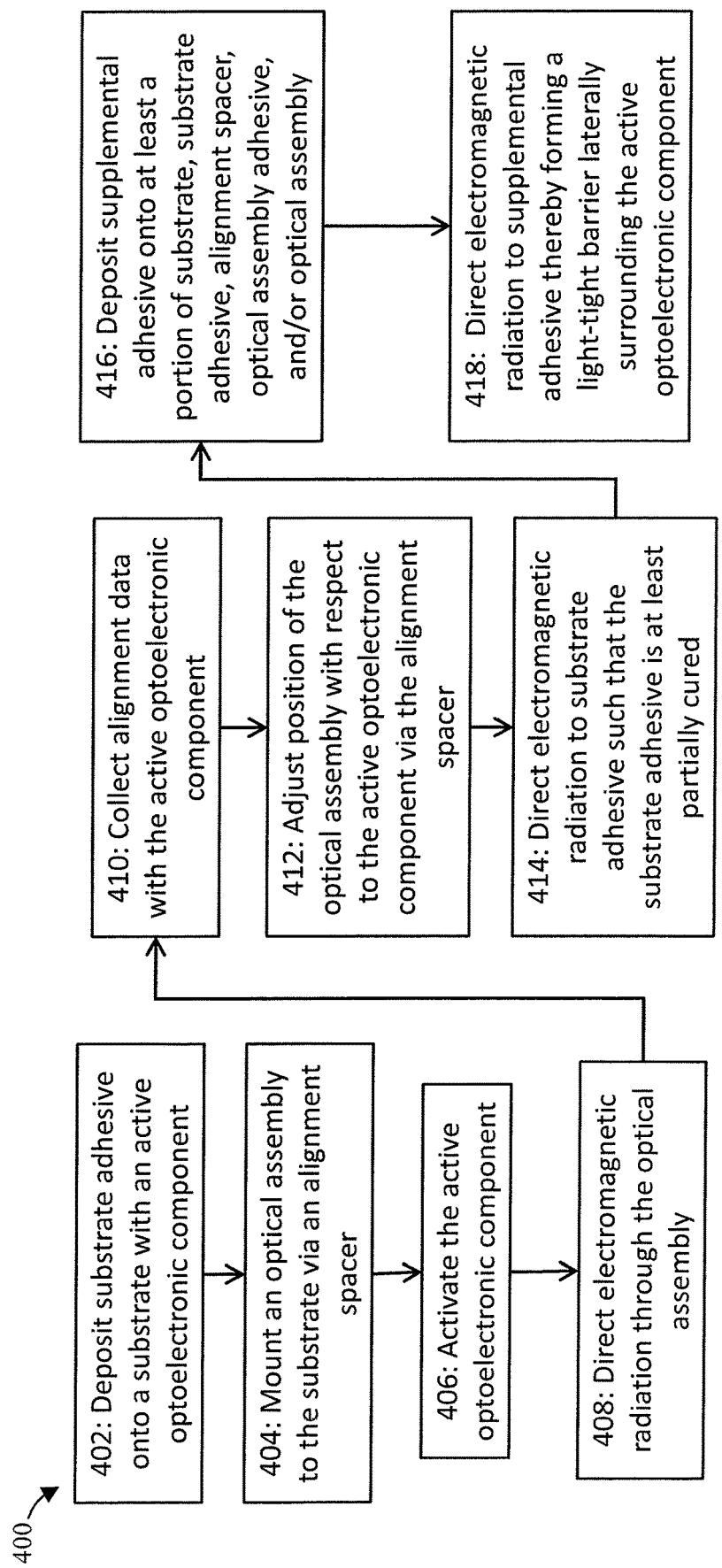
FIG. 4 depicts an example method for manufacturing an optoelectronic module having one or more alignment spacers.

FIG. 4 depicts an example method for manufacturing an optoelectronic module having one or more alignment spacers. In a step 402, substrate adhesive 117 is deposited onto a substrate 107 with an active optoelectronic component 109.

In another step 404, an optical assembly 103 is mounted to the substrate 107 via an alignment spacer 105. In another step 406, the active optoelectronic component 109 is activated. For example, in instances where the active optoelectronic component 109 is light-sensitive, the component 109 is powered-up, initialized and in other ways made ready to collect light and store intensity values. In other instances, for example, where the active optoelectronic component 109 is light-emitting, the component 109 is powered-up and made to generate light.

In another step 408, electromagnetic radiation is directed through the optical assembly 103. For example, electromagnetic radiation can be focused by one or more optical elements within the optical assembly 103 either on the optoelectronic component 109 (in instance where the component 109 is light sensitive) or onto an imaging device external to the optoelectronic module 100 (in instances where the component 109 is light emitting).

In another step 410, alignment data is collected with the active optoelectronic component 109. That is, the active optoelectronic component 109 can be used to collect data in instances where the component 109 is light sensitive, or an imaging device external to the optoelectronic module 100 can be used to collect data in instances where the component 109 is light-emitting.

In another step 412, the position of the optical assembly 103 with respect to the active optoelectronic component 109 is adjusted via the alignment spacer 105. In instances where the optical assembly 103 includes optical elements 110 characterized by a focal length, the position of the optical assembly 103 can be adjusted until the focal length is incident on the active optoelectronic component 109.

In another step 414, electromagnetic radiation is directed to the substrate adhesive 117 such that the substrate adhesive 117 is at least partially cured. The electromagnetic radiation can be infrared or ultraviolet, for example.

In another step 416, supplemental adhesive 120 is deposited onto at least a portion of the substrate 107, substrate adhesive 117, alignment spacer 105, optical assembly adhesive 113, and/or optical assembly 103.

In another step 418, electromagnetic radiation is directed onto supplemental adhesive 120 thereby forming a light-tight barrier laterally surrounding the active optoelectronic component. The electromagnetic radiation can be infrared or ultraviolet, for example.

Various modifications may be made to the foregoing implementations. Features described above in different implementations may be combined in the same implementations. Thus, other implementations are within the scope of the claims.

What is claimed is:

1. An optoelectronic module, the optoelectronic module comprising:
   an optical assembly fixed to a first extension of an alignment spacer, the optical assembly being fixed to the first extension with an optical assembly adhesive;
   a substrate fixed to a second extension of the alignment spacer, the substrate being fixed to the second extension with a substrate adhesive;
   an active optoelectronic component mounted to the substrate and substantially aligned with the optical assembly;
   the first and second extension being positioned on laterally opposing sides of the alignment spacer; and
   the second extension of the alignment spacer including a surface operable to limit the lateral migration of the substrate adhesive, wherein the second extension includes one or more chamfered surfaces, the one or more chamfered surfaces delineating the surface operable to limit the lateral migration of the substrate adhesive and wherein the one or more chamfered surfaces include a groove.

2. The optoelectronic module of claim 1, wherein the second extension of the alignment spacer includes one or more grooves.

3. The optoelectronic module of claim 2, wherein the substrate includes one or more alignment extensions, the one or more alignment extensions being operable to integrate within the one or more grooves.

4. The optoelectronic module of claim 1, wherein the substrate includes one or more sockets, the one or more sockets being configured such that the one or more second extensions can be integrated within the one or more sockets.

5. The optoelectronic module of claim 1, the optical assembly further including one or more optical elements.

6. The optoelectronic module of claim 5, wherein the one or more optical elements is selected from the list consisting of: a microlens array, a refractive optical element, and a diffractive optical element.

7. The optoelectronic module of claim 6, wherein the optical assembly further includes a spectral filter.

8. The optoelectronic module of claim 1, the optical assembly being characterized by a focal length, wherein the distance between the optical assembly and the active optoelectronic component is substantially equal to the focal length.

9. The optoelectronic module of claim 1, wherein the active optoelectronic component is selected from the list consisting of: a light-emitting diode, a laser diode, an array of light-emitting diodes, and an array of laser diodes each being operable to generate a wavelength or range of wavelengths of electromagnetic radiation.

10. The optoelectronic module of claim 9, wherein the optical assembly adhesive and the substrate adhesive are substantially non-transparent to the wavelength or range of wavelengths of electromagnetic radiation generated by the active optoelectronic component.

11. The optoelectronic module of claim 10, the optoelectronic module further including supplemental adhesive, the supplemental adhesive being substantially non-transparent to the wavelength or range of wavelengths of electromagnetic radiation generated by the active optoelectronic component, the supplemental adhesive being in contact with at least a portion of the optoelectronic module thereby forming a light-tight barrier laterally surrounding the active optoelectronic component.

12. The optoelectronic module of claim 1, the active optoelectronic component including one or more light-sensitive pixels, the one or more light-sensitive pixels being sensitive to a wavelength or range of wavelengths of electromagnetic radiation.

13. The optoelectronic module of claim 12, wherein the optical assembly adhesive and the substrate adhesive are substantially non-transparent to the wavelength or range of wavelengths of electromagnetic radiation to which the active optoelectronic component is sensitive.

14. The optoelectronic module of claim 13, the optoelectronic module further includes supplemental adhesive, the supplemental adhesive being substantially non-transparent to the wavelength or range of wavelengths of electromagnetic radiation to which the active optoelectronic component is sensitive, the supplemental adhesive being in contact with at least a portion of the optoelectronic module thereby forming a light-tight barrier laterally surrounding the active optoelectronic component.

15. A method for manufacturing an optoelectronic module having an alignment spacer, the method comprising:
depositing uncured substrate adhesive onto a substrate;
mounting an alignment spacer onto the substrate,
wherein the alignment spacer includes a first extension and a second extension, the first extension and second extension positioned on laterally opposing sides of the alignment spacer,
wherein the substrate is fixed to the second extension of the alignment spacer,
wherein the second extension includes a surface operable to limit the lateral migration of the substrate adhesive,
wherein the second extension includes one or more chamfered surfaces, the one or more chamfered surfaces delineating the surface operable to limit the lateral migration of the substrate adhesive, and
wherein the one or more chamfered surfaces include a groove;
mounting an optical assembly to the first extension of the alignment spacer;
adjusting the position of the optical assembly with respect to the active optoelectronic component via the alignment spacer;
directing electromagnetic radiation to the uncured substrate adhesive such that the uncured substrate adhesive is at least partially cured;
activating the active optoelectronic component;
directing electromagnetic radiation through the optical assembly to the active optoelectronic component;
collecting alignment data with the active optoelectronic component; and
adjusting the position of the optical assembly with respect to the active optoelectronic component via the alignment spacer, the position being determined by the alignment data collected by the active optoelectronic component.

16. The method of claim 15 further comprising:
depositing uncured supplemental adhesive onto at least a portion of the optoelectronic module; and
directing electromagnetic radiation to the uncured supplemental adhesive such that the uncured supplemental adhesive is at least partially cured thereby forming a light-tight barrier laterally surrounding the active optoelectronic component.

* * * * *